United States Patent [19]

Sekouri et al.

[11] Patent Number: 5,148,352
[45] Date of Patent: Sep. 15, 1992

[54] U-SHAPED MOUNTING MODULE FOR MOUNTING COMPONENTS OF AN INFORMATION PROCESSING MACHINE

[75] Inventors: Omar Sekouri, Paris; Gilles Jardet, Chilly Mazarin, both of France

[73] Assignee: Bull, S.A., Paris, France

[21] Appl. No.: 592,461

[22] Filed: Oct. 5, 1990

[30] Foreign Application Priority Data

Oct. 5, 1989 [FR] France ............... 89 13035

[51] Int. Cl.⁵ .................................. H05K 7/14
[52] U.S. Cl. .................. 361/391; 220/4.29; 220/675; 211/41
[58] Field of Search ............. 206/334; 220/4.08, 4.29, 220/6, 675; 361/380, 391, 392, 393, 394, 395, 399, 415, 412, 429; 211/41; 248/174, 300

[56] References Cited

U.S. PATENT DOCUMENTS

| | | | |
|---|---|---|---|
| 3,497,127 | 2/1970 | Box | 220/6 X |
| 4,165,003 | 8/1979 | Drader | 220/675 X |
| 4,513,064 | 4/1985 | Marcus | 361/412 X |
| 4,528,616 | 7/1985 | Koppensteiner | 361/399 |
| 4,593,441 | 6/1986 | St. Louis . | |
| 4,662,515 | 5/1987 | Newby, Sr. | 220/6 X |
| 4,717,989 | 1/1988 | De Barros et al. | 361/395 X |
| 4,739,452 | 4/1988 | Fukunaga | 361/399 |
| 4,769,741 | 9/1988 | Smith | 361/395 |
| 4,864,469 | 9/1989 | Boudon | 361/395 |
| 4,899,257 | 2/1990 | Yamamoto | 361/395 |
| 5,003,430 | 3/1991 | VonArx et al. | 361/395 |

FOREIGN PATENT DOCUMENTS

2502445  9/1982  France .

OTHER PUBLICATIONS

IBM Technical Disclosure Bulletin, vol. 29, No. 5, Oct. 1986, pp. 2013-2017; "Flexible Guide for Printed Circuit Cards".

Machine Design, vol. 59, No. 2, Jan. 22, 1987, pp. 52; "Modular Chassis Design Cuts Scope Costs".

*Primary Examiner*—Leo P. Picard
*Assistant Examiner*—Michael W. Phillips
*Attorney, Agent, or Firm*—Kerkam, Stowell, Kondracki & Clarke

[57] ABSTRACT

A mounting module made of three molded surfaces (2, 6, 8) is provided, in which a central surface (6) is connected to the other two (2, 8) via openings (65, 67), and cutouts (68, 66) cooperating with tabs (27, 28, 85, 88), in such a manner as to form a U-shaped cross-section member after assembly, the side surfaces (2, 8) of which are kept spaced apart by cooperating struts (20, 80) integrally attached to each of the side surfaces (2, 8). One of the side surfaces (2, 8) includes hooks (21, 22) for mounting the module to a support plate (90), via openings (906, 905, 904) on the support plate, and a latching element (907, 22) which immobilizes the U-shape mounting module (2, 6, 8) on the support plate, the module having electronic elements mounted thereto.

9 Claims, 3 Drawing Sheets

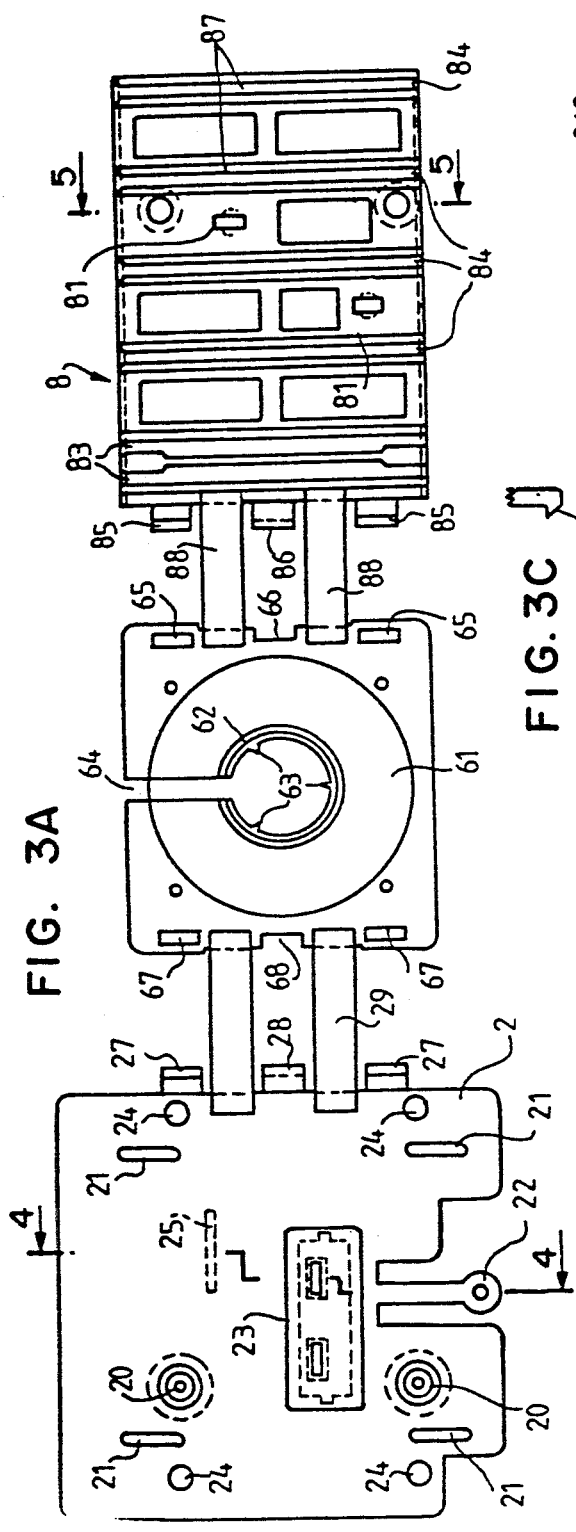
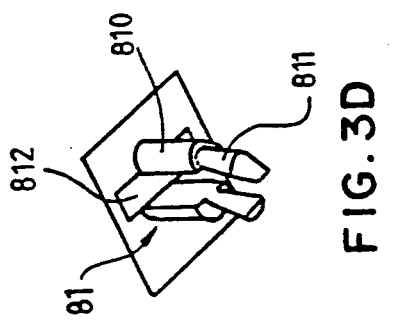
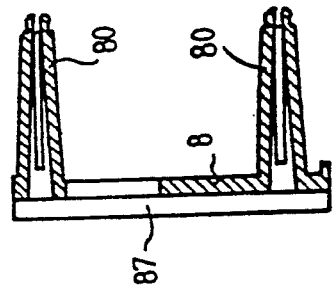
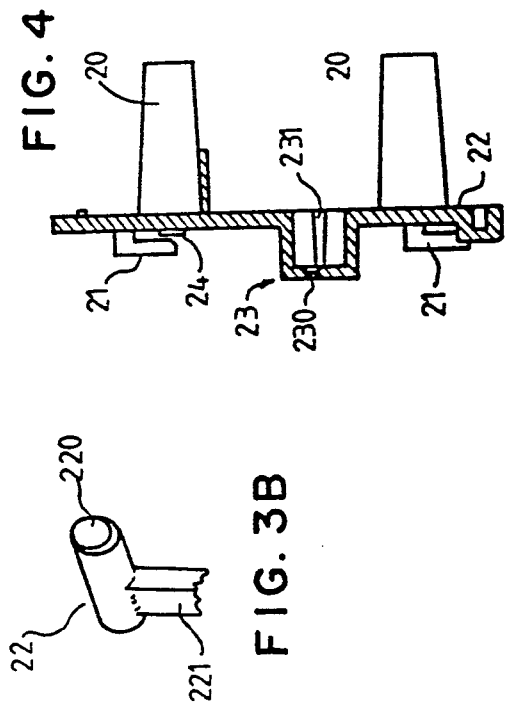

U-SHAPED MOUNTING MODULE FOR MOUNTING COMPONENTS OF AN INFORMATION PROCESSING MACHINE

FIELD OF THE INVENTION

The invention relates to a multifunctional mounting module for an information processing machine, such as a microcomputer.

BACKGROUND OF THE INVENTION

In information processing machines or microcomputers, there is a need for the mounting or fixation of certain constituent elements such as a speaker, operating light, and so forth. Moreover, the capability of installing optional equipment in the machines sometimes requires adding further electronic boards to the main board. Most of the time screw systems are used for mounting these elements, but such screw systems must be manipulated in very small spaces. Further, they entail additional manufacturing expense.

OBJECTS AND SUMMARY OF THE INVENTION

A first object of the invention is accordingly to propose a multifunctional mounting module that can simply be mounted in the machine chassis.

This object is attained by making the multifunctional mounting module with three surfaces; a central surface is connected to the other two surfaces via openings or cutouts that cooperate with pins, in such a manner that after assembly it forms a U-shaped cross section. The side surfaces of the U are kept spaced apart by struts integrally formed with each of the side surfaces, and one of the side surfaces includes means for mounting or fixation to a support plate, via hooks cooperating with openings, and a latching means that immobilizes the mounting module.

A further object of the invention is to permit the mounting or fixation of a speaker in an information processing machine.

This object is attained by providing the central surface of the module adjacent to and extending between the two side surfaces with a frustoconical surface ending in a cylindrical sleeve open on one side, and including clamping pegs for the socket of a speaker.

A further object is to permit the mounting or fixation of signaling means.

This object is attained in that the side surface having means for mounting the module to the support plate includes a boss, which is provided with openings and grooves formed on the inside side walls of the boss, in order to receive an electronic board, including signal diodes that can be seen through the openings.

A further object is to enable the guidance of electronic boards.

This object is attained in that the side surface facing the fixation side surface includes molded grooves on its outer face.

A further object is to enable the mounting or fixation of a printing wiring board to the module.

This object is attained by providing the inside face of the side surface, facing the mounting or fixation side surface, with fixation dog points for a printed wiring board provided with connection zones.

A further object of the invention is to enable the use of the multifunctional module so that with the aid of the chassis, the fixation of additional electronic boards is assured.

This object is attained by providing the support plate as the front face of the chassis of the computer, and providing grooves on the rear side surface of the module adapted to cooperate with grooves made facing them in the rear face of the computer chassis, to enable the mounting or fixation of electronic boards that can be plugged to connectors provided on the main electronic board of the machine.

A final object of the invention is to propose a method of manufacture of the mounting module.

This object is attained in that the method comprises using a single mold only once, molding the three surfaces connected to one another by connecting strips in substantially planar configuration, in such a manner as to form a single piece; folding the connecting strips to a position wherein the pins of one of the surfaces cooperate the openings and wherein cutouts of the adjacent surface and the struts located on each of the extreme facing side surfaces are joined; latching the pins in the openings and fastening the struts.

Further characteristics and advantages of the present invention will become more apparent from the ensuing detailed description, taken in conjunction with the drawings.

BRIEF DESCRIPTION OF THE DRAWING

FIG. 3A is a plan view of the mounting module, made by the three elements joined into a single piece after molding.

FIG. 3B is an exploded view of a tongue on one side section of the module;

FIG. 3C is an exploded view of one of the joining tabs on a side section;

FIG. 3D is an exploded view of a peg disposed on a side surface of the module;

FIG. 4 is a sectional view of the module taken along line 4—4 of FIG. 3A; and

FIG. 5 is a sectional view of the module taken along line 5—5 of FIG. 3A.

DESCRIPTION OF THE PREFERRED EMBODIMENT

Figure 1:
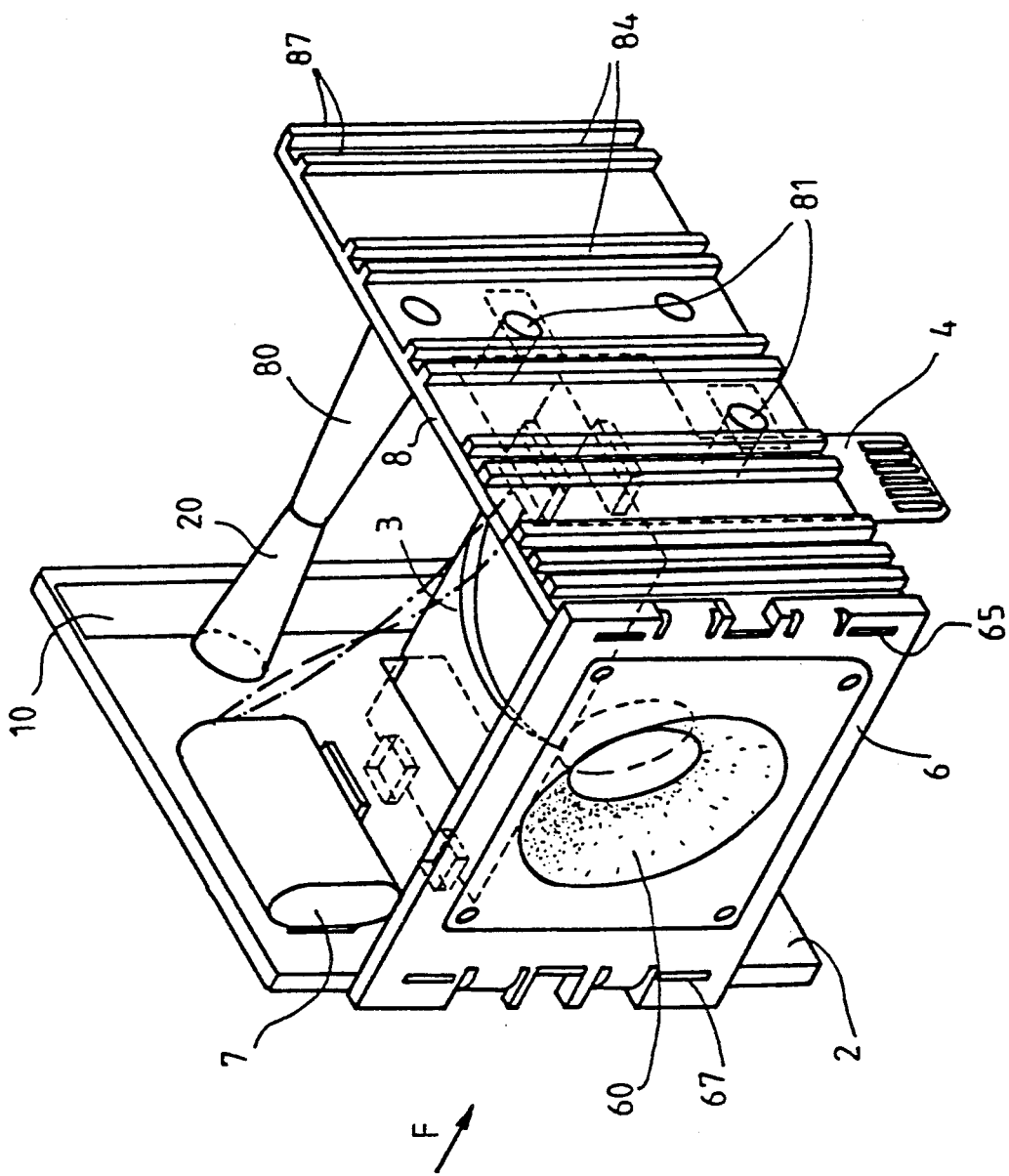
FIG. 1 is a perspective view of the mounting module according to the invention.

Once it has been assembled and is ready to be attached to the chassis of a machine, the mounting module shown in FIG. 1 includes three surfaces 2, 6, 8; a central surface 6 and two side surfaces 2, 8 substantially form a U-shaped element. The two side surfaces 2, 8 are kept spaced apart with the aid of struts 20, 80 that are each integrally formed with a respective surface 2, 8. The side surfaces 2, 8 are integral with the central surface 6 by assembly with the aid of tabs 27, 28, 85, 86 on the side surfaces corresponding openings 67, 65 and cutouts, 66, 68 in central surfaces 6 (see FIG. 3A).

The tabs mounted at the end of one of the surfaces include a central tab 28, 86 (see FIG. 3C), surrounded by two side tabs 27, 85, which are oriented in opposite directions from the direction of the central tab 28, 86. The pin 26, 28 that cooperates with the cutout 66, 68 is oriented toward the central surface 6. With the corresponding openings 67, 65 and the cutouts 66, 68 associated with the central tab oriented toward the edge of the cutout, this arrangement makes possible an assembly of the parts 2, 6, 8 by a locking of the tabs in the cutouts and openings that is not easily dismantled. The central surface 6 includes a frustoconical portion 61 that terminates toward the center in a cylindrical ring 62, which is provided with pegs 63 on its inner periphery. The surface 6, the frustoconical portion 61 and the ring 62 are provided with a slit 64 that is open at the outer edge of the surface 6. This slit 64 makes it possible to lend a certain elasticity to the part 6, so that the socket of a speaker 60 can be received in the opening formed by the ring 62.

Figure 2:
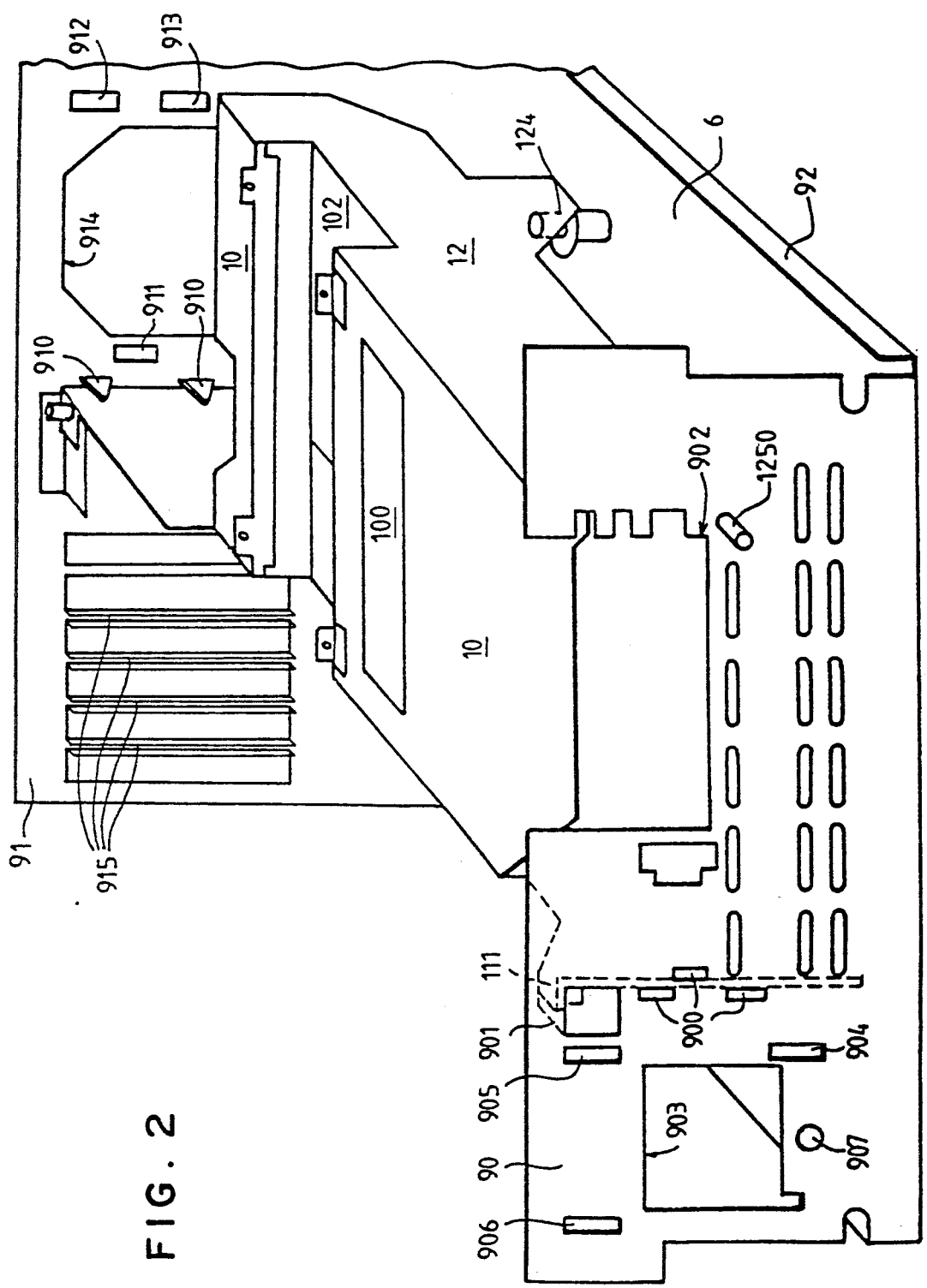
FIG. 2 is a perspective view of the chassis of a machine with which the mounting module can be used.

A first side surface 2, or mounting side surface, includes a set of hooks 21 oriented toward the outside of the U-shaped solid, and a boss 23, as shown in FIG. 3A and FIG. 4. The boss 23 includes two openings 230, and on its two inside surfaces it has two grooves 231 that enable the guidance and fixation of a printed wiring board (element 3, in FIG. 1) carrying light emitting diodes, which comprise signal lights that can be seen through the opening 230. The surface 2 also includes a tongue 221 provided with a dog point 220 forming a latching element 22. Formed on the inside face of this surface 2 are two cylindrical pegs 20 comprising half-struts; ends disposed on the inside face of an end of each peg 20 having an opening or orifice adapted to be engaged by a dog point provided on an end of each half-strut 80 (FIG. 5) disposed on the inside face of the second side surface 8, which will face and engage half-struts 20 when the module is shaped into a U. The inside face of the second side surface also includes two pegs 81, which comprise two half-cylinders 810 disposed on either side of an opening 812 (see FIG. 3D) and extended at their ends by frustoconical portions 811 that enable them to be snapped elastically into place. These two pegs 81 enable the mounting of a second printed wiring board 4 seen in FIG. 1, by engaging holes drilled in corresponding locations on the printed wiring board. A succession of grooves 83, 84, is formed on the outer face of the second surface 8, by the molding of ribs 87 on this outer face. The set of the three surfaces is made in a single mold, and comprises a single piece, wherein surface 2 is joined to the central surface 6 by connecting strips 29, and surface 6 is joined to the second side surface 8 by connecting strips 88. This enables simple molding, and the mounting module is assembled by folding the connecting strips 29, 88, so that the tabs can then be introduced into the corresponding openings and cutouts on the central surface. Once the tabs have been latched into the openings, and the dog points of the half-struts 80 have been anchored in the orifices of the struts 20, the U-shaped member is complete. At this time, the printed wiring board 3 can be introduced into the groove 231, followed by the mounting of the printed wiring board 4 to the pegs 81, and finally, the speaker is put into place in its receptacle 63, and the hooks 21 of the thus-equipped set are placed through the cutouts 904, 906, 905 provided on the front face 90 of the chassis of a machine shown in FIG. 2. The dog point 220 penetrates the circular opening 907 and translationally immobilizes the part on its support 90. The opening 903 enables the passage therethrough of the boss 23 and the observation of the functional states of the machine. Once the part is fixed to the front support 90 of the chassis, it is located with its rear surface 8 facing the back plate 91 of the machine chassis. As can be seen in FIG. 2, the back plate 91 includes a set of grooves 915 made by cutting and bending the sheet metal. These grooves 915 face corresponding grooves 83 84 formed between the ribs on the back face of the mounting module. Guide grooves for are thus obtained additional electronic boards that can be mounted to the machine chassis and connected to connectors mounted on the printed wiring board 6 comprising the main board of the machine.

Any modifications within the competence of one skilled in the art may be made without departing from the spirit and scope of the invention.

What is claimed is:

1. A mounting module for mounting components thereon and adapted to be mounted in a computer, said mounting module comprising a central surface (6) and two other surfaces (2, 8) said central surface and said two other surfaces being of a single piece of material, said mounting module further comprising means for connecting the central surface (6) to said two other surfaces (2, 8) so as to form a U-shaped cross-section, said means for connecting comprising a plurality of tabs on said two other surfaces, and means disposed on said central surface for engaging said tabs in such a manner that after assembly said module has said U-shaped cross section, said two other surfaces forming first and second side surfaces (2, 8), of the module, said module further comprising half-struts (20, 80) integrally attached to each of said first and second side surfaces (2, 8) and adapted to engage each other for spacing said first and second side surfaces, said first side surface (2) including hook means (21, 22) for mounting to a support plate.

2. The mounting module as defined by claim 1, wherein said central surface (6) adjacent to said two side surfaces (2, 8) includes a frustoconical surface (61) ending in a sleeve (62) open on one side (64), said sleeve including clamping pegs (63) for retaining the socket of a speaker (60).

3. The mounting module as defined by claim 1 or 2, wherein the first of said side surfaces (2) for mounting to the support plate (90) includes a boss (23) having openings (230) and grooves (231) formed on inside side walls of the boss whereby an electronic board (3) adapted to be received by said openings and grooves will be seen through the openings (230).

4. The mounting module as defined by claim 3, wherein said second side surface (8) includes, on its inside face, peg means for attaching a printed wiring board (4) to said second side surface, said second side surface being disposed to face said first side surface.

5. The mounting module as defined by claim 4, wherein the second side surface (8), facing the first side surface (2), includes, on its outer face, molded grooves (83, 84).

6. The mounting module as defined by claim 1 or 2, wherein the second side surface (8), facing the first side surface (2), includes, on its outer face, molded grooves (83, 84).

7. The mounting module as defined by claim 1 or 2, wherein said second side surface (8) includes, on its inside face, peg means for attaching a printed wiring board (4) to said second side surface, said second side surface.

8. The mounting module as defined in claim 1 wherein said hook means on said first side surface are engageable with corresponding openings on a support plate of said computer, the mounting means further comprising latching means on said first side surface for engaging said support plate to immobilize said mounting module.

9. The mounting module as defined in claim 8 wherein a second side surface is a rear side surface of the mounting module, and wherein an outer face of said second side surface has a plurality of molded grooves disposed thereon, whereby, when said support plate is a front face of a chassis of said computer, said plurality of molded grooves will be adapted to cooperate with associated facing grooves on a rear face of said computer chassis to retain opposite ends of electronic boards between pairs of associated grooves on said mounting module and said computer chassis.

* * * * *

UNITED STATES PATENT AND TRADEMARK OFFICE
CERTIFICATE OF CORRECTION

PATENT NO. : 5,148,352
DATED : September 15, 1992
INVENTOR(S) : Sekouri, et al

It is certified that error appears in the above-identified patent and that said Letters Patent is hereby corrected as shown below:

Claim 7, line 5 (Col.4, line 61), after "surface", add --facing the first side surface--.

Signed and Sealed this

Fourteenth Day of December, 1993

Attest:

BRUCE LEHMAN

Attesting Officer    Commissioner of Patents and Trademarks